United States Patent [19]
Tsai et al.

[11] Patent Number: 6,096,629
[45] Date of Patent: Aug. 1, 2000

[54] UNIFORM SIDEWALL PROFILE ETCH METHOD FOR FORMING LOW CONTACT LEAKAGE SCHOTTKY DIODE CONTACT

[75] Inventors: Jun-Lin Tsai, Hsin-Chu; Yen-Shih Ho, Chai-Yi, both of Taiwan

[73] Assignee: Taiwan Semiconductor Manufacturing Company, Hsin-Chu, Taiwan

[21] Appl. No.: 09/187,301

[22] Filed: Nov. 5, 1998

[51] Int. Cl.[7] .................................................. H01L 21/28
[52] U.S. Cl. .......................... 438/570; 438/580; 438/758; 438/760
[58] Field of Search ............................. 438/72, 570, 580, 438/581, 582, 583, 758, 760, 167

[56] References Cited

U.S. PATENT DOCUMENTS

| | | | |
|---|---|---|---|
| 4,233,337 | 11/1980 | Friedman et al. | 427/84 |
| 4,397,079 | 8/1983 | Nagarajan et al. | 438/328 |
| 4,619,887 | 10/1986 | Hooper et al. | 430/313 |
| 5,021,840 | 6/1991 | Morris | 357/15 |
| 5,117,276 | 5/1992 | Thomas et al. | 257/758 |
| 5,268,316 | 12/1993 | Robinson et al. | 437/34 |
| 5,296,406 | 3/1994 | Readdie et al. | 438/570 |
| 5,619,064 | 4/1997 | Cho | 257/637 |
| 5,940,726 | 8/1999 | Yu | 438/597 |
| 5,960,312 | 9/1999 | Morikawa | 438/624 |

*Primary Examiner*—John F. Niebling
*Assistant Examiner*—Christopher Lattin
*Attorney, Agent, or Firm*—George O. Saile; Stephen B. Ackerman; Alek P. Szecsy

[57] ABSTRACT

A method for forming a Schottky diode. There is first provided a silicon layer. There is then formed upon the silicon layer an anisotropically patterned first dielectric layer which defines a Schottky diode contact region of the silicon layer. There is then formed and aligned upon the anisotropically patterned first dielectric layer a patterned second dielectric layer which is formed of a thermally reflowable material. There is then reflowed thermally the patterned second dielectric layer to form a thermally reflowed patterned second dielectric layer having a uniform sidewall profile with respect to the anisotropically patterned first dielectric layer while simultaneously forming a thermal silicon oxide layer upon the Schottky diode contact region of the silicon layer. There is then etched while employing a first etch method the thermal silicon oxide layer from the Schottky diode contact region of the silicon layer while preserving the uniform sidewall profile of the thermally reflowed patterned second dielectric layer with respect to the anisotropically patterned first dielectric layer. There is then formed and thermally annealed upon the thermally reflowed patterned second dielectric layer and the Schottky diode contact region of the silicon layer a metal silicide forming metal layer to form in a self aligned fashion a metal silicide layer upon the Schottky diode contact region of the silicon layer, a protective oxide surface layer upon the metal silicide layer and a metal silicide forming metal layer residue upon the thermally reflowed patterned second dielectric layer. There is then stripped from the thermally reflowed patterned second dielectric layer the metal silicide forming metal layer residue. Finally, there is then etched while employing a second etch method the protective oxide surface layer from the metal silicide layer, where the second etch method also preserves the uniform sidewall profile of the thermally reflowed patterned second dielectric layer with respect to the anisotropically patterned first dielectric layer.

10 Claims, 3 Drawing Sheets

UNIFORM SIDEWALL PROFILE ETCH METHOD FOR FORMING LOW CONTACT LEAKAGE SCHOTTKY DIODE CONTACT

BACKGROUND OF THE INVENTION

1. Field of the Invention

The present invention relates generally to methods for forming Schottky diode contacts within microelectronics fabrications. More particularly, the present invention relates to methods for forming with low contact leakage Schottky diode contacts within microelectronics fabrications.

2. Description of the Related Art

Microelectronics fabrications are formed from microelectronics substrates over which are formed patterned microelectronics conductor layers which are separated by microelectronics dielectric layers. The patterned microelectronics conductor layers employed within microelectronics fabrications typically interconnect microelectronics devices which are in turn typically, but not exclusively, semiconductor integrated circuit microelectronics devices formed within and/or upon semiconductor substrates employed within semiconductor integrated circuit microelectronics fabrications.

When fabricating semiconductor integrated circuit microelectronics devices, there is often employed a metal layer (or metal silicide layer) to lightly doped semiconductor substrate layer contact, generally known as Schottky diode contact, for the purposes of forming semiconductor integrated circuit microelectronics device electrodes, as well as for other purposes generally related to the performance of the semiconductor integrated circuit microelectronics devices.

While Schottky diode contacts are thus desirable within the art of microelectronics fabrication, and in particular within the art of semiconductor integrated circuit microelectronics fabrication, Schottky diode contacts are often not formed entirely without problems within the air of microelectronics fabrication. In particular, it is often difficult to form within semiconductor integrated circuit microelectronics devices Schottky diode contacts which provide Schottky diode structures which exhibit sufficiently uniform or stable Schottky diode operating parameters, such as but not limited to a Schottky diode clamp voltage, to provide fully functional or reliable operation of a microelectronics fabrication within which is formed the semiconductor integrated microelectronics device employing the Schottky diode contact which provides the Schottky diode structure exhibiting the insufficiently uniform or stable Schottky diode operating parameters.

It is thus towards the goal of forming within microelectronics fabrications in general, and within semiconductor integrated circuit microelectronics fabrications more particularly, Schottky diode contacts which provide Schottky diode structures which exhibit uniform and stable operating parameters that the present invention is directed.

Various methods have been generally disclosed for forming metal to semiconductor substrate contacts within semiconductor integrated circuit microelectronics fabrications and more particularly for forming metal to lightly doped semiconductor substrate Schottky diode contacts within semiconductor integrated circuit microelectronics fabrications.

For example, Friedman et al., in U.S. Pat. No. 4,233,337, discloses a method for selectively forming multiple series of metal to silicon semiconductor substrate layer contacts employing differing metallization layers formed upon a single semiconductor substrate within a semiconductor integrated circuit microelectronics fabrication. The method employs a series of thermal silicon oxide mask layers formed upon a series of contact regions of a silicon semiconductor substrate, where at least a first group of thermal silicon oxide mask layers is additionally masked with a photoresist layer to allow hydrofluoric acid etching of a second group of photoresist unmasked thermal silicon oxide layers prior to forming a metal contact layer upon portions of the semiconductor substrate exposed after hydrofluoric acid etching of the second group of thermal silicon oxide mask layers. The photoresist layer may then be removed from at least the first group of thermal silicon oxide mask layers and the first group of thermal silicon oxide mask layers may similarly be etched prior to forming a different metal contact layer upon portions of the semiconductor substrate exposed after hydrofluoric acid etching of the first group of thermal silicon oxide layers.

In addition, Morris, in U.S. Pat. No. 5,021,840, discloses a method for forming with attenuated contact leakage a Schottky diode contact with a silicon semiconductor substrate within a semiconductor integrated circuit microelectronics fabrication. The method employs a dielectric sidewall spacer layer formed adjoining a sidewall of a patterned dielectric layer which defines the Schottky diode contact region within the silicon semiconductor substrate and upon which Schottky diode contact region a platinum silicide anode layer is formed, where the dielectric sidewall spacer layer attenuates isotropic sidewall etching of the patterned dielectric layer which may otherwise lead to contact leakage of the Schottky diode contact at the periphery of the platinum silicide anode layer.

Finally, Robinson et al., in U.S. Pat. No. 5,268,316, discloses a method for fabricating a Schottky diode structure within a semiconductor substrate, where the Schottky diode structure employs: (1) a localized diode well as a substrate for a Schottky diode contact; (2) a buried diode interconnection layer; and (3) a diode ohmic contact region. Each of the localized diode well, the buried diode interconnection layer and the diode ohmic contact region is formed simultaneously with a corresponding structure employed within a bipolar metal oxide semiconductor field effect transistor (FET) structure formed simultaneously with the Schottky diode structure.

Desirable within the art of microelectronics fabrication are additional methods which may be employed for forming within microelectronics fabrications Schottky diode contacts which provide Schottky diode structures with uniform and stable operating parameters, such as but not limited to Schottky diode clamp voltages.

It is towards that goal that the present invention is directed.

SUMMARY OF THE INVENTION

A first object of the present invention is to provide a method for forming within a microelectronics fabrication a Schottky diode contact employed within a Schottky diode structure.

A second object of the present invention is to provide a method for forming a Schottky diode contact in accord with the first object of the present invention, where the Schottky diode contact provides the Schottky diode structure with uniform and stable operating parameters.

A third object of the present invention is to provide a method in accord with the first object of the present invention and the second object of the present invention, which method is readily commercially implemented.

In accord with the objects of the present invention, there is provided by the present invention a method for forming a Schottky diode within a microelectronics fabrication. To form the Schottky diode of the present invention, there is first provided a substrate employed within a microelectronics fabrication. There is then formed over the substrate a silicon layer. There is then formed upon the silicon layer an anisotropically patterned first dielectric layer which defines a Schottky diode contact region of the silicon layer. There is then formed and aligned upon the anisotropically patterned first dielectric layer a patterned second dielectric layer which is formed of a thermally reflowable material. There is then reflowed thermally the patterned second dielectric layer to form a thermally reflowed patterned second dielectric layer having a uniform sidewall profile with respect to the anisotropically patterned first dielectric layer while simultaneously forming a thermal silicon oxide layer upon the Schottky diode contact region of the silicon layer. There is then etched while employing a first etch method the thermal silicon oxide layer from the Schottky diode contact region of the silicon layer while preserving the uniform sidewall profile of the thermally reflowed patterned second dielectric layer with respect to the anisotropically patterned first dielectric layer. There is then formed upon the thermally reflowed patterned second dielectric layer and contacting the Schottky diode contact region of the silicon layer a metal silicide forming metal layer. There is then annealed thermally in an oxidizing atmosphere the silicon layer and the metal silicide forming metal layer to form in a self aligned fashion a metal silicide layer upon the Schottky diode contact region of the silicon layer, a protective oxide layer upon the metal silicide layer and a metal silicide forming metal layer residue upon the thermally reflowed patterned second dielectric layer. There is then stripped from the thermally reflowed patterned second dielectric layer the metal silicide forming metal layer residue. Finally, there is then etched, while employing a second etch method, the protective oxide layer from the metal silicide layer, where the second etch method also preserves the uniform sidewall profile of the thermally reflowed patterned second dielectric layer with respect to the anisotropically patterned first dielectric layer.

The present invention provides a method for forming within a microelectronics fabrication a Schottky diode contact employed within a Schottky diode structure, where the Schottky diode contact provides the Schottky diode structure with uniform and stable operating parameters. The method of the present invention realizes the foregoing object by employing when forming the Schottky diode contact an anisotropically patterned first dielectric layer which defines a Schottky diode contact region within a silicon layer formed beneath the anisotropically patterned first dielectric layer, where: (1) the anisotropically patterned first dielectric layer has a thermally reflowed patterned second dielectric layer formed thereupon with a uniform sidewall profile of the thermally reflowed patterned second dielectric layer with respect to the anisotropically patterned first dielectric layer; and (2) each of two subsequent etch methods employed in forming a metal silicide layer upon the Schottky diode contact region of the silicon layer preserves the uniform sidewall profile of the reflowed patterned second dielectric layer with respect to the anisotropically patterned first dielectric layer.

The method of the present invention is readily commercially implemented. The method of the present invention employs methods and materials as are generally known in the art of microelectronics fabrication. Since it is the process sequence and process control that provides at least in part the method of the present invention, rather than the existence of methods and materials which provides the method of the present invention, the method of the present invention is readily commercially implemented.

BRIEF DESCRIPTION OF THE DRAWINGS

The objects, features and advantages of the present invention are understood within the context of the Description of the Preferred Embodiment which follows. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronics fabrication a Schottky diode contact within a Schottky diode structure, where the Schottky diode contact provides the Schottky diode structure with uniform and stable operating parameters. The method of the present invention realizes the foregoing object by employing when forming the Schottky diode contact an anisotropically patterned first dielectric layer which defines a Schottky diode contact region within a silicon layer formed beneath the anisotropically patterned first dielectric layer, where: (1) the anisotropically patterned first dielectric layer has a thermally reflowed patterned second dielectric layer formed thereupon with a uniform sidewall profile of the thermally reflowed patterned second dielectric layer with respect to the anisotropically patterned first dielectric layer; and (2) each of two subsequent etch methods employed in forming a metal silicide layer upon the Schottky diode contact region of the silicon layer does not compromise the uniform sidewall profile of the reflowed patterned second dielectric layer with respect to the anisotropically patterned first dielectric layer.

Although the present invention provides value when forming Schottky diode contacts within Schottky diode structures and related semiconductor integrated circuit microelectronics devices within semiconductor integrated circuit microelectronics fabrications, the method of the present invention may similarly also be employed when forming Schottky diode contacts within Schottky diode structures and related structures within microelectronics fabrications including but not limited to semiconductor integrated circuit microelectronics fabrications, solar cell microelectronics fabrications, ceramic substrate microelectronics fabrications and flat panel display microelectronics fabrications.

Figure 1:
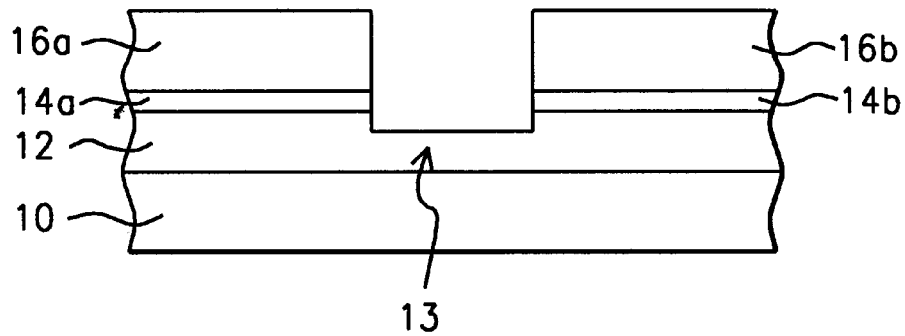
FIG. 1, FIG. 2, FIG. 3, FIG. 4, FIG. 5, FIG. 6 and FIG. 7 show a series of schematic cross-sectional diagrams illustrating the results of forming within a microelectronics fabrication in accord with a preferred embodiment of the present invention a Schottky diode structure employing a Schottky diode contact.

Referring now to FIG. 1 to FIG. 7, there is shown a series of schematic cross-sectional diagrams illustrating the results of progressive stages in forming within a microelectronics fabrication in accord with a preferred embodiment of the present invention a Schottky diode structure. Shown in FIG. 1 is a schematic cross-sectional diagram of the Schottky diode structure at an early stage in its formation in accord with the present invention.

Shown in FIG. 1 is a substrate 10 having formed thereover a silicon layer 12 having a Schottky diode contact region 13 formed therein, where the Schottky diode contact region 13 is defined by a pair of patterned first dielectric layers 14a and 14b in turn having formed and aligned thereupon a pair of patterned second dielectric layers 16a and 16b. The microelectronics fabrication whose schematic cross-sectional diagram is illustrated in FIG. 1 is typically and preferably formed by a photoresist mask layer anisotropic etching of a corresponding blanket second dielectric layer from which is formed the patterned second dielectric layers 16a and 16b, a corresponding blanket first dielectric layer from which is formed the patterned first dielectric layers 14a and 14b, and an unetched silicon layer from which is formed the silicon layer 12. Thus, the patterned second dielectric layers 16a and 16b, and the patterned first dielectric layers 14a and 14b, are typically and preferably anisotropically patterned. The slight recess within the silicon layer 12 at the Schottky diode contact region 13 of the silicon layer 12 is typically formed incident to overetching when forming from the blanket second dielectric layer the patterned second dielectric layers 16a and 16b and when forming from the blanket first dielectric layer the patterned first dielectric layers 14a and 14b.

Within the preferred embodiment of the present invention with respect to the substrate 10, the substrate 10 may be a substrate employed within a microelectronics fabrication including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate has any of several additional layers formed thereover as are conventional within the microelectronics fabrication within which is employed the substrate. Such additional microelectronics layers may include, but are not limited to, microelectronics conductor layers, microelectronics semiconductor layers and microelectronics dielectric layers as are similarly conventional within the microelectronics fabrication within which is employed the substrate.

Within the preferred embodiment of the present invention, the substrate 10 is more preferably a silicon semiconductor substrate alone employed within a semiconductor integrated circuit microelectronics fabrication. Although such semiconductor substrates are known within the art of semiconductor integrated circuit microelectronics fabrication with either dopant polarity, several dopant concentrations and various crystallographic orientations, yet more preferably, for the preferred embodiment of the present invention, the substrate 10 is a (100) silicon semiconductor substrate having an N- or P- doping and a diameter of six inches. Process parameters disclosed within the remainder of this disclosure are predicated upon assumption of a substrate of such diameter.

Within the preferred embodiment of the present invention with respect to the silicon layer 12, the silicon layer 12 may be formed employing methods and materials as are conventional in the art of microelectronics fabrication to provide the silicon layer 12 which provides the Schottky diode contact region 13 of width about 2 to about 10 microns from which a Schottky diode structure may be fabricated. Such silicon layers may be formed employing methods including but not limited to epitaxial growth methods, chemical vapor deposition methods and physical vapor deposition (PVD) sputtering methods to form silicon layers of silicon materials typically including either monocrystalline silicon materials or polycrystalline silicon materials. In order to form a Schottky diode structure while employing the Schottky diode contact region 13 of the silicon layer 12, the silicon layer 12 will typically and preferably have a resistivity of from about 0.35 to about 0.42 ohm-cm, which resistivity is typically achieved via introduction into the silicon material from which is formed the silicon layer 12 a dopant at a dopant concentration of from about 1E16 to about 3E16 dopant atoms per cubic centimeter. As is common in the art of microelectronics fabrication, appropriate dopants typically include, but are not limited to arsenic dopants, boron dopants and phosphorus dopants. Typically and preferably, the silicon layer 12 is formed to a thickness of from about 1.1 to about 1.5 microns upon or integral to the substrate 10.

Within the preferred embodiment of the present invention with respect to the patterned first dielectric layers 14a and 14b, the patterned first dielectric layers 14a and 14b are preferably formed employing methods and materials as are conventional in the art of microelectronics fabrication to provide the patterned first dielectric layers 14a and 14b of an undoped dielectric material which serves as a barrier to diffusion of dopants into or from the silicon layer 12. Such undoped dielectric materials typically include, but are not limited to, silicon oxide dielectric materials, silicon nitride dielectric materials and silicon oxynitride dielectric materials formed employing methods including but not limited to chemical vapor deposition (CVD) methods, plasma enhanced chemical vapor deposition (PECVD) methods and physical vapor deposition (PVD) sputtering methods. Within the preferred embodiment of the present invention, the patterned first dielectric layers 14a and 14b are more preferably formed of a silicon oxide dielectric material formed employing a plasma enhanced chemical vapor deposition (PECVD) method, as is conventional in the art of microelectronics fabrication. Preferably, the patterned first dielectric layers 14a and 14b are each formed to a thickness of from about 1500 to about 1700 angstroms upon the silicon layer 12.

Within the first preferred embodiment of the present invention with respect to the patterned second dielectric layers 16a and 16b, the patterned second dielectric layers 16a and 16b are, similarly with the patterned first dielectric layers 14a and 14b, each preferably also formed employing methods and materials as are conventional in the art of microelectronics fabrication, but the patterned second dielectric layers 16a and 16b are each preferably formed employing a second dielectric material which is susceptible to thermal reflow processing. Such dielectric materials typically include, but are not limited to, doped silicate glass dielectric materials, such as but not limited to boro silicate glass (BSG) dielectric materials, phospho silicate glass (PSG) dielectric materials and boro phospho silicate glass (BPSG) dielectric materials. Typically and preferably, the patterned second dielectric layers 16a and 16b are each formed to a thickness of from about 8500 to about 8900 angstroms upon the corresponding patterned first dielectric layers 14a and 14b.

Figure 2:
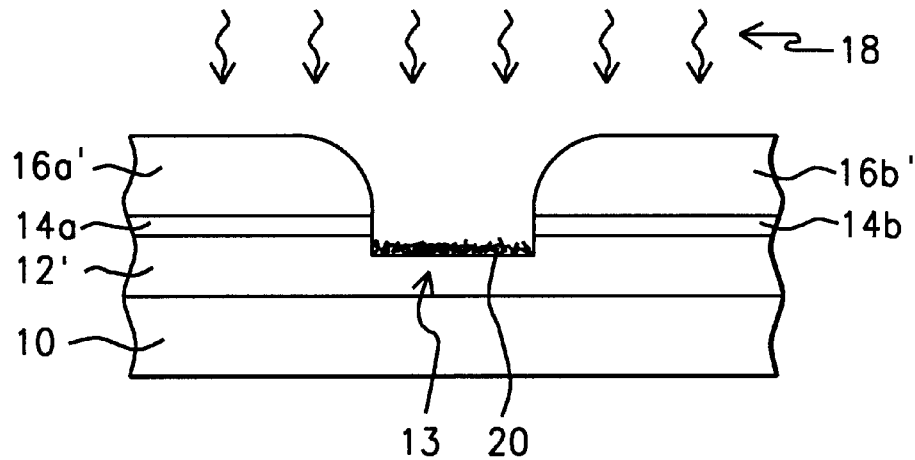

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the patterned second dielectric layers 16a and 16b have been thermally reflowed incident to exposure to a first thermal treatment 18 to form a pair of reflowed patterned second dielectric layers 16a' and 16b', while simultaneously forming a thermally oxidized silicon oxide layer 20 upon the Schottky diode contact region 13 of a partially oxidized silicon layer 12' formed from the silicon layer 12. Within the first preferred embodiment of the present invention, the first thermal treatment 18 preferably employs: (1) a temperature of from about 920 to about 925 degrees centigrade; (2) a reactor chamber pressure of from about 1013 to about 1023 torr; (3) an ambient atmosphere of oxygen followed by nitrogen, either of which at a flow rate of from about 14 to about 15 standard liters per minute (slpm); and (4) an exposure time of from about 20 minutes in oxygen followed by an exposure time of about 20 minutes in nitrogen. Incident to the first thermal treatment, the otherwise sharp edges of the patterned second dielectric layers 16a and 16b which define in part an aperture which accesses the Schottky diode contact region 13 of the partially oxidized silicon layer 12' are sufficiently smoothed such that when subsequently forming a patterned conductor metal layer within the aperture the patterned conductor metal layer may be formed without discontinuity which might otherwise compromise functionality or reliability of the patterned conductor metal layer. Thus, as is illustrated within the schematic cross-sectional diagram of FIG. 2, the reflowed patterned second dielectric layers 16a' and 16b' are formed with a uniform sidewall profile with respect to the patterned first dielectric layers 14a and 14b. Within the context of the present disclosure, "uniform sidewall profile" is intended to describe a smooth sidewall profile of the reflowed patterned second dielectric layers 16a' and 16b' with respect to the patterned first dielectric layers 14a and 14b, without a discontinuity or protrusion of the reflowed patterned second dielectric layers 16a' and 16b' with respect to the patterned first dielectric layers 14a and 14b.

Figure 3:
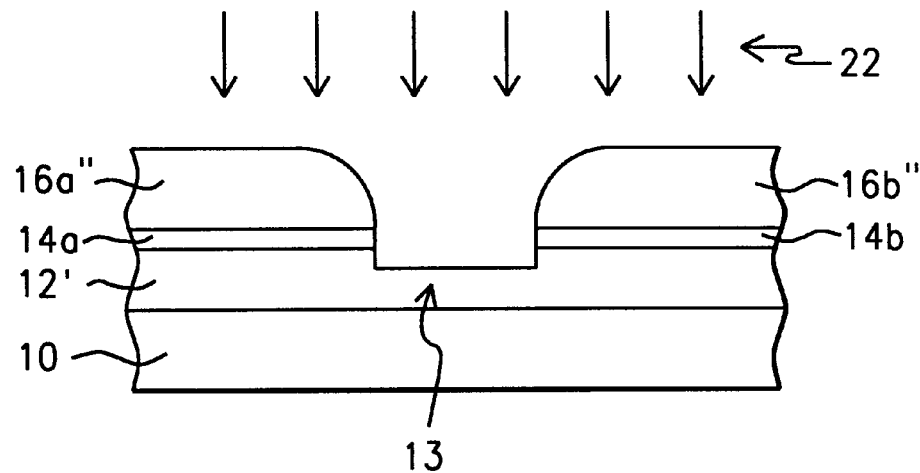

Referring now to FIG. 3, there is shown a schematic cross-sectional diagram illustrating the results of further processing of the microelectronics fabrication whose schematic cross-sectional diagram is illustrated in FIG. 2. Shown in FIG. 3 is a schematic cross-sectional diagram of a microelectronics fabrication otherwise equivalent to the microelectronics fabrication whose schematic cross-sectional diagram is illustrated in FIG. 2, but wherein: (1) the thermally oxidized silicon oxide layer 20 has been stripped from the Schottky diode contact region 13 of the partially oxidized silicon layer 12' while employing an anisotropic etching plasma 22; and (2) the reflowed patterned second dielectric layers 16a' and 16b' have been anisotropically etched to form a pair of anisotropically etched reflowed patterned second dielectric layers 16a" and 16b", incident to etching the thermally oxidized silicon oxide layer 20 while employing the anisotropic etching plasma 22. As is illustrated within the schematic cross-sectional diagram of FIG. 3, the uniform sidewall profile of the anisotropically etched reflowed patterned second dielectric layers 16a" and 16b" with respect to the patterned first dielectric layers 14a and 14b is preserved incident to etching within the anisotropic etching plasma 22.

Within the preferred embodiment of the present invention, the anisotropic etching plasma 22 preferably employs an etchant gas composition which upon plasma activation forms a fluorine containing etchant species. Preferably, the fluorine containing etchant species is derived from an etchant gas selected from the group consisting of perfluorocarbons, hydrofluorocarbons, sulfur hexafluoride and nitrogen trifluoride. Similarly, the anisotropic etching plasma 22 may also incorporate a sputtering gas component, such as but not limited to a noble gas such as argon. Most preferably, within the preferred embodiment of the present invention, the etchant gas composition employed within the anisotropic etching plasma 22 comprises carbon tetrafluoride.

Preferably the anisotropic etching plasma also employs: (1) a reactor chamber pressure of from about 880 to about 950 mtorr; (2) a source radio frequency power of from about 90 to about 100 watts (which is generally substantially lower than a source radio frequency power of from about 400 to about 700 watts typically employed within anisotropic plasma etch methods for etching silicon oxide layers); (3) a substrate 10 temperature of from about zero to about 40 degrees centigrade; and (4) a carbon tetrafluoride flow rate of from about 80 to about 125 standard cubic centimeters per minute (sccm), for a time period sufficient to completely remove the thermally oxidized silicon oxide layer 20 from the partially oxidized silicon layer 12' as illustrated within the microelectronics fabrication whose schematic cross-sectional diagram is illustrated in FIG. 2 to provide the microelectronics fabrication whose schematic cross-sectional diagram is illustrated in FIG. 3.

While not wishing to be bound by any single particular theory of operation of the present invention, it is believed that by employing the anisotropic etching plasma 22 rather than an isotropic etch method, such as a wet chemical etch method, for stripping from the microelectronics fabrication whose schematic cross-sectional diagram is illustrated in FIG. 2 the thermally oxidized silicon oxide layer 20, the reflowed patterned second dielectric layers 16a' and 16b' are etched in a fashion such that the integrity of the patterned first dielectric layers 14a and 14b is maintained. For comparative purposes, when employing wet chemical etch methods which typically employ hydrofluoric acid containing solutions which in turn typically etch thermally reflowable doped silicate glass dielectric layers more rapidly than silicon oxide layers formed employing plasma enhanced chemical vapor deposition (PECVD) methods, it is believed that a microelectronics fabrication structure such as that illustrated in FIG. 8 is typically generally formed.

Figure 8:
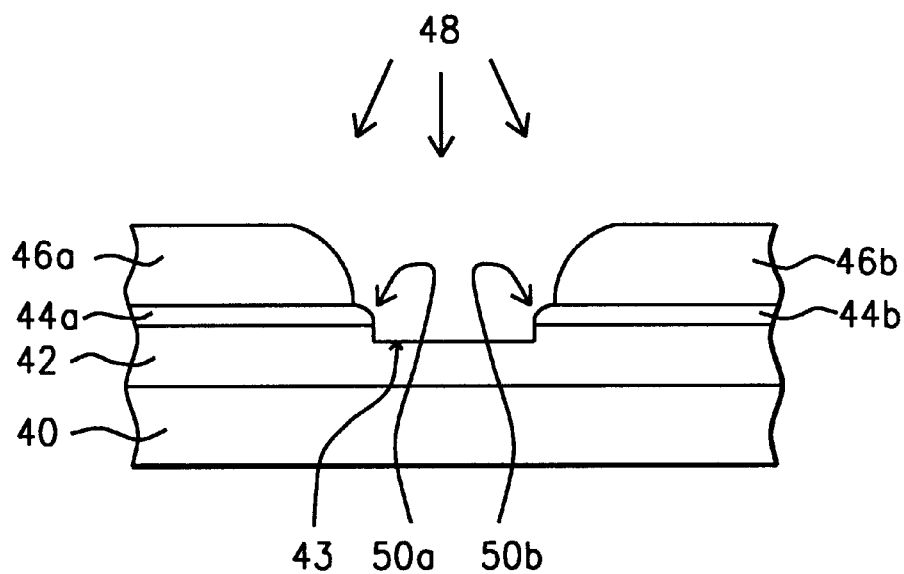
FIG. 8 shows a schematic cross-sectional diagram of a microelectronics fabrication within which may be formed a Schottky diode contact not in accord with the present invention.

Shown in FIG. 8 is a substrate 40 having formed thereupon a partially oxidized silicon layer 42 having defined therein a Schottky diode contact region 43 from which has been stripped a thermally oxidized silicon oxide layer (not shown) employing an isotropic etchant 48. As is illustrated within FIG. 8, a pair of isotropically etched patterned first dielectric layers 44a and 44b is formed protruding beneath a pair of isotropically etched reflowed patterned second dielectric layers 46a and 46b due to a more facile etching of isotropically etched reflowed patterned second dielectric layers 46a and 46b with respect to the pair of isotropically etched patterned first dielectric layers 44a and 44b within the isotropic etchant 48. It is believed that a pair of "bird's beak" type protrusions 50a and 50b of the pair of isotropically etched patterned first dielectric layers 44a and 44b is particularly susceptible to etching when further processing the microelectronics fabrication whose schematic cross-sectional diagram is illustrated in FIG. 8, and thus may provide upon further processing in accord with that employed within the preferred embodiment of the present invention undesirable electrical current leakage pathways. As is illustrated within the schematic cross-sectional diagram of FIG. 8, the isotropically etched reflowed patterned second dielectric layers 46a and 46b do not have a uniform sidewall profile with respect to the patterned first dielectric layers 44a and 44b.

Figure 4:
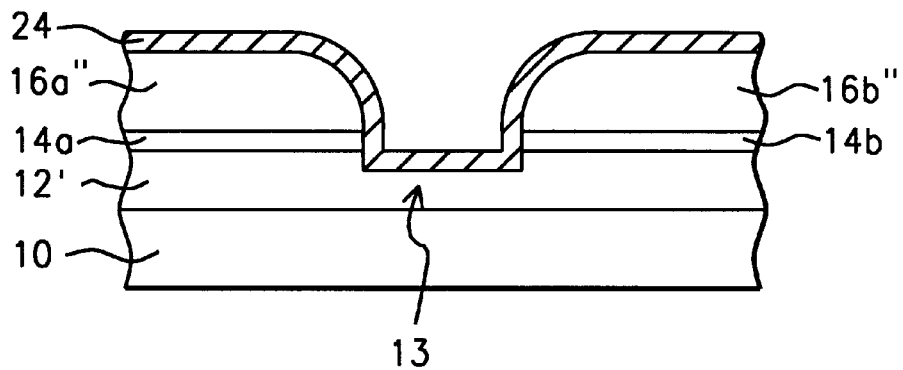

Referring now to FIG. 4, there is shown a schematic cross-sectional diagram illustrating the results of further processing of the microelectronics fabrication whose schematic cross-sectional diagram is illustrated in FIG. 3. Shown in FIG. 4 is a schematic cross-sectional diagram of a microelectronics fabrication otherwise equivalent to the microelectronics fabrication whose schematic cross-sectional diagram is illustrated within FIG. 3, but wherein there is formed upon the anisotropically etched reflowed patterned second dielectric layers 16a″ and 16b″ and the Schottky diode contact region 13 of the partially oxidized silicon layer 12' a blanket metal silicide forming metal layer 24.

Within the preferred embodiment of the present invention with respect to the blanket metal silicide forming metal layer 24, the blanket metal silicide forming metal layer 24 may be formed employing methods and materials as are conventional in the art of microelectronics fabrication, where such methods include but are not limited to thermally assisted evaporation methods, electron beam assisted evaporation methods, chemical vapor deposition (CVD) methods and physical vapor deposition (PVD) methods to form blanket metal silicide forming metal layers of metal silicide forming metals including but not limited to titanium, tungsten, cobalt, molybdenum and platinum. Within the preferred embodiment of the present invention, the blanket metal silicide forming metal layer 24 is preferably formed of a platinum metal silicide forming metal, preferably formed to a thickness of from about 650 to about 850 angstroms upon the anisotropically etched reflowed patterned second dielectric layers 16a″ and 16b″ and the Schottky diode contact region 13 of the partially oxidized silicon layer 12'.

Figure 5:
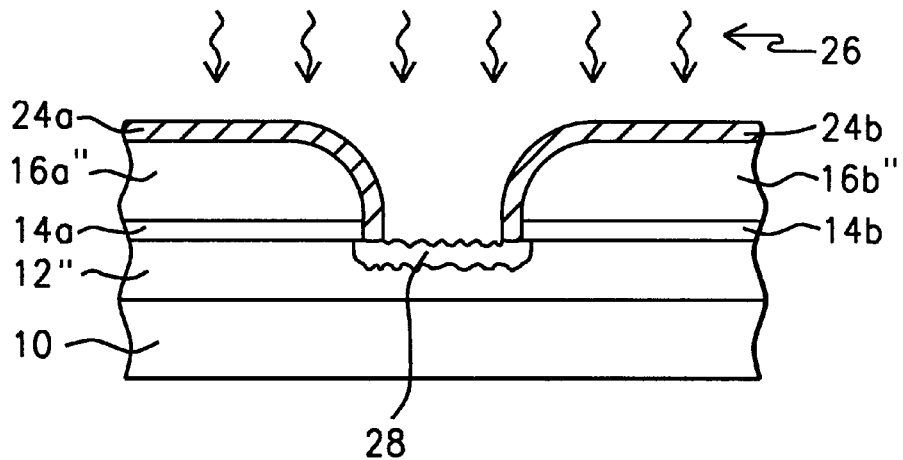

Referring now to FIG. 5, there is shown a schematic cross-sectional diagram illustrating the results of further processing of the microelectronics fabrication whose schematic cross-sectional diagram is illustrated in FIG. 4. Shown in FIG. 5 is a schematic cross-sectional diagram of a microelectronics fabrication otherwise equivalent to the microelectronics fabrication whose schematic cross-sectional diagram is illustrated in FIG. 4, but wherein the blanket metal silicide forming metal layer 24 has been thermally annealed employing a second thermal treatment 26 to form a patterned metal silicide layer 28 in conjunction with partial consumption of the Schottky diode contact region 13 of the partially oxidized silicon layer 12' to form a depleted partially oxidized silicon layer 12″, along with a resulting pair of patterned metal silicide forming metal layer residues 24a and 24b upon other portions of the microelectronics fabrication.

Within the preferred embodiment of the present invention, the second thermal treatment 26 is typically and preferably of a temperature and a duration such that the blanket metal silicide forming metal layer 24 is completely consumed at the location of the Schottky diode contact region 13 of the partially oxidized silicon layer 12' when forming the patterned metal silicide layer 28, although the blanket metal silicide forming metal layer 24 need not be completely consumed when forming the patterned metal silicide layer 28. Typically and preferably, the second thermal treatment 26 employs: (1) a temperature of from about 340 to about 450 degrees centigrade; (2) a reactor chamber pressure of from about 1013 to about 1023 torr; (3) a sequential nitrogen-oxygen-nitrogen ambient at a flow rate of about 14 standard liters per minute (slpm), for a time period sufficient to completely consume the blanket metal silicide forming metal layer 24 at the location of the Schottky diode contact region 13 of the partially oxidized silicon layer 12' when forming the patterned metal silicide layer 28 and the depleted partially oxidized silicon layer 12″. Under such conditions, there is typically and preferably formed upon the surface of the patterned metal silicide layer 28 which has a thickness of from about 650 to about 750 angstroms a protective oxide surface layer which in turn has a thickness of about 20 to about 40 angstroms.

Figure 6:
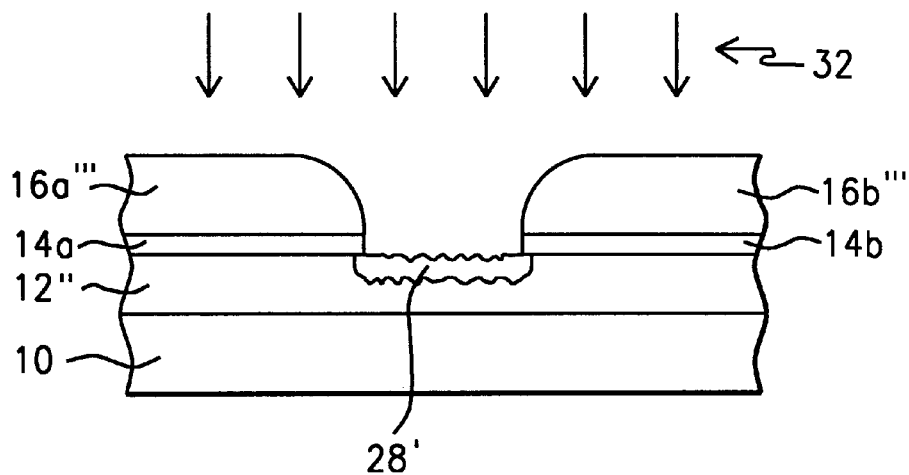

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronics fabrication otherwise equivalent to the microelectronics fabrication whose schematic cross-sectional diagram is illustrated in FIG. 5, but wherein: (1) the patterned metal silicide forming metal layer residues 24a and 24b are stripped from the microelectronics fabrication; and (2) the anisotropically etched reflowed patterned second dielectric layers 16a″ and 16b″ and the patterned metal silicide layer 28 are then treated with an anisotropic sputtering treatment 32 to form a pair of anisotropically sputtered anisotropically etched reflowed patterned second dielectric layers 16a‴ and 16b‴, along with an anisotropically sputtered patterned metal silicide layer 28'. Within the preferred embodiment of the present invention, the anisotropic sputtering treatment 32 preserves the uniform surface profile of the anisotropically sputtered anisotropically etched reflowed patterned second dielectric layers 16a‴ and 16b‴ with respect to the patterned first dielectric layers 14a and 14b.

Figure 7:
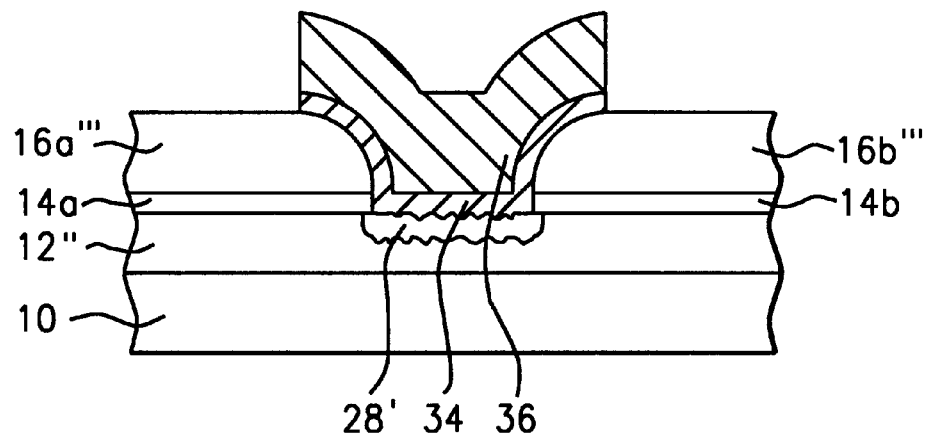

Within the preferred embodiment of the present invention, the patterned metal silicide forming metal layer residues 24a and 24b may be stripped from the microelectronics fabrication whose schematic cross-sectional diagram is illustrated in FIG. 6 to provide in part the microelectronics fabrication whose schematic cross-sectional diagram is illustrated in FIG. 7 employing methods as are conventional in the art of microelectronics fabrication, where such methods will typically, but not exclusively, employ wet chemical stripping methods. For the more preferred embodiment of the present invention where the patterned metal silicide forming metal layer residues 24a and 24b are formed of a platinum metal silicide forming metal, the patterned metal silicide forming metal layer residues 24a and 24b are preferably stripped employing a aqueous hydrochloric acid and nitric acid (i.e. aqua regia) solution.

Within the preferred embodiment of the present invention, the anisotropic sputtering treatment 32 preferably employs an argon sputtering ion, although other inert sputtering ions may also be employed. Preferably, the anisotropic sputtering treatment 32 also employs: (1) a reactor chamber base pressure of from about 3E-7 to about 3.5E-7 mtorr (with an argon pressure of about 2.5 mtorr; (2) a bias sputtering power of from about 500 to about 550 watts; (3) a substrate 10 temperature of from about 30 to about 35 degrees centigrade, for a time period sufficient to completely remove the protective oxide surface layer from the patterned metal silicide layer 28.

Since within the preferred embodiment of the present invention the anisotropically sputtered anisotropically etched reflowed patterned second dielectric layers 16a‴ and 16b'" are formed with a uniform sidewall profile with respect to the patterned first dielectric layers 14a and 14b, and there is no "bird's beak" protrusion of the patterned first dielectric layers 14a and 14b with respect to the anisotropically sputtered anisotropically etched reflowed patterned second dielectric layers 16a'" and 16b'", there is an attenuated susceptibility of exposing the depleted partially oxidized silicon layer 12" and forming a Schottky diode leakage pathway through other than the anisotropically sputtered patterned metal silicide layer 28'.

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein there is formed overlapping (preferably completely overlapping) the anisotropically sputtered patterned metal silicide layer 28' a patterned barrier layer 34 having formed and aligned thereupon a patterned conductor layer 36.

The patterned barrier layer 34 and the patterned conductor layer 36 are formed upon the microelectronics fabrication whose schematic cross-sectional diagram is illustrated in FIG. 7 employing methods as are conventional in the art of microelectronics fabrication. The patterned barrier layer 34 may be formed of barrier materials including but not limited to titanium nitride barrier materials and titanium tungsten barrier materials, while the patterned conductor layer 36 may be formed of conductor materials including but not limited to aluminum, aluminum alloy, copper, copper alloy, tungsten and tungsten alloy conductor materials. Preferably, the patterned barrier layer 34 is formed to a thickness of from about 1200 to about 1400 angstroms, while the patterned conductor layer 36 is formed to a thickness of from about 4500 to about 5500 angstroms.

Upon forming the microelectronics fabrication whose schematic cross-sectional diagram is illustrated in FIG. 7, there is formed a microelectronics fabrication having formed therein a Schottky diode structure where a Schottky diode contact within the Schottky diode structure has an attenuated susceptibility to electrical current conduction through other than a patterned metal silicide layer which is employed as a conductor contact layer within the Schottky diode structure. The Schottky diode contact has attenuated susceptibility to leakage by preserving a uniform sidewall profile of a pair of patterned second dielectric layers formed upon and with respect to a pair of patterned first dielectric layers which in turn define a Schottky diode contact region within a silicon layer within the microelectronics fabrication when the pair of patterned second dielectric layers is treated with various plasma and sputtering treatments when forming the Schottky diode structure.

EXAMPLES

There were obtained two eight inch diameter (100) silicon semiconductor substrates and formed thereupon two series of microelectronics fabrication structures similar to the microelectronics fabrication structure illustrated in FIG. 2. Each silicon semiconductor substrate had formed thereupon an epitaxial silicon layer of thickness about 5 microns and of doping concentration about 3E16 dopant atoms per cubic centimeter. Defining a series of Schottky diode contact regions of linewidth about 50 microns within the epitaxial silicon layers was a pair of patterned first dielectric layers formed to a thickness of about 200 angstroms employing a thermal oxidation method. Formed and aligned upon the pair of patterned first dielectric layers was a pair of thermally reflowed patterned second dielectric layers originally formed of a boro phospho silicate glass (BPSG) dielectric material originally formed employing a chemical vapor deposition (CVD) method and subsequently reflowed at a temperature of about 920 degrees centigrade. The thermal reflow treatment simultaneously formed a series of thermally oxidized silicon oxide layers of thickness about 105 angstroms upon the series of Schottky diode contact regions of the epitaxial silicon layer.

One of the semiconductor substrates was then processed employing an isotropic wet chemical etch employing a 50:1 buffered oxide etchant (BOE) (ammonium fluoride and hydrofluoric acid) solution at a temperature of about 23.5 degrees centigrade for a time period of about 3 minutes.

The other semiconductor substrate was then processed employing an anisotropic plasma etch method employing a carbon tetrafluoride etchant gas composition. The anisotropic plasma etch method also employed: (1) a reactor chamber pressure of about 880 mtorr; (2) a source radio frequency power of about 400 watts at a source radio frequency of 13.56 MHZ; (3) a semiconductor substrate temperature of 40 degrees centigrade; (5) a carbon tetrafluoride flow rate of 125 standard cubic centimeters per minute; and (6) a plasma exposure time of about 35 seconds.

The two semiconductor substrates were reunited and there was formed upon each semiconductor substrate a platinum layer of thickness about 450 angstroms employing a physical vapor deposition (PVD) sputtering method as is conventional in the art of microelectronics fabrication. The two semiconductor substrates were then thermally annealed at a temperature of 450 degrees centigrade within an oxygen ambient for a time period of about 20 minutes followed by a nitrogen ambient for a time period of about 20 minutes to form a series of patterned platinum silicide layers upon the Schottky diode contact regions of the semiconductor substrates, along with a series of platinum metal layer residues upon other portions of the semiconductor substrates, where the series of patterned platinum silicide layers had formed thereupon a series of protective oxide surface layers.

The platinum metal layer residues were then stripped from the semiconductor substrates employing a 3:1:4 volume ratio aqua regia (aqueous 28% nitric acid:37% hydrochloric acid:deionized water) solution. The protective oxide surface layers formed upon the patterned platinum silicide layers were then stripped employing an anisotropic argon ion sputter etch method. The argon ion sputter etch method also employed: (1) a reactor chamber pressure of about 2.5 mtorr; (2) a bias sputtering power of about 500 watts; (3) a substrate temperature of about 30 degrees centigrade; and (4) an exposure time of about 250 seconds.

There was then formed upon each of the remaining argon ion sputter etched platinum silicide layers within each of the Schottky diode contact regions a patterned barrier layer of titanium tungsten of thickness about 1200 angstroms having formed and aligned thereupon a patterned conductor layer of an aluminum alloy of thickness about 5000 angstroms.

Each series of Schottky diode structures formed upon each of the two semiconductor substrates was then electrically tested employing test methods as are conventional in the art of microelectronics fabrication to ascertain the stability and uniformity of the Schottky diode clamp voltages. The mean values and standard deviations of Schottky diode clamp voltages are reported within Table I, along with values of Cpk, a statistical parameter which relates the standard deviations to the mean values (higher values of Cpk indicate greater uniformity within a statistical data set).

TABLE I

| Example | Schottky Contact Etch | Clamp Voltage | Cpk |
| --- | --- | --- | --- |
| 1 | BOE | 0.37 +/− 0.08 | 0.7 |
| 2 | CF4 plasma | 0.45 +/− 0.01 | 2.5 |

As is seen from review of the data within Table I, the use of an anisotropic plasma etch method which maintains a uniform sidewall profile of a pair of dielectric layers which defines a Schottky diode contact region of a semiconductor substrate, in place of an isotropic wet chemical etch method, for treating the Schottky diode contact region of a semiconductor substrate prior to forming upon the Schottky diode contact region of the semiconductor substrate a metal silicide layer provides more uniform performance of a Schottky diode formed upon the semiconductor substrate.

As is understood by a person skilled in the art, the preferred embodiment and examples of the present invention are descriptive of the present invention rather than limiting of the present invention. Revisions and modifications may be made to methods, materials, structures and dimensions through which may be formed Schottky diode structures in accord with the preferred embodiment and examples of the present invention while still providing Schottky diode structures in accord with the present invention, as defined by the accompanying claims.

What is claimed is:

1. A method for forming a Schottky diode comprising:
   providing a substrate employed within a microelectronics fabrication;
   forming over the substrate a silicon layer;
   forming upon the silicon layer an anisotropically patterned first dielectric layer which defines a Schottky diode contact region of the silicon layer;
   forming and aligning upon the anisotropically patterned first dielectric layer a patterned second dielectric layer which is formed of a thermally reflowable material;
   reflowing thermally the patterned second dielectric layer to form a thermally reflowed patterned second dielectric layer having a uniform sidewall profile with respect to the anisotropically patterned first dielectric layer while simultaneously forming a thermal silicon oxide layer upon the Schottky diode contact region of the silicon layer;
   etching while employing a first etch method the thermal silicon oxide layer from the Schottky diode contact region of the silicon layer while preserving the uniform sidewall profile of the thermally reflowed patterned second dielectric layer with respect to the anisotropically patterned first dielectric layer;
   forming upon the thermally reflowed patterned second dielectric layer and contacting the Schottky diode contact region of the silicon layer a metal silicide forming metal layer;
   annealing thermally in an oxidizing atmosphere the silicon layer and the metal silicide forming metal layer to form in a self aligned fashion a metal silicide layer upon the Schottky diode contact region of the silicon layer, a protective oxide surface layer upon the metal silicide layer and a metal silicide forming metal layer residue upon the thermally reflowed patterned second dielectric layer;
   stripping from the thermally reflowed patterned second dielectric layer the metal silicide forming metal layer residue; and
   etching while employing a second etch method the protective oxide surface layer from the metal silicide layer, the second etch method also preserving the uniform sidewall profile of the thermally reflowed patterned second dielectric layer with respect to the anisotropically patterned first dielectric layer.

2. The method of claim 1 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

3. The method of claim 1 wherein the silicon layer is selected from the group consisting of monocrystalline silicon layers and polycrystalline silicon layers.

4. The method of claim 1 wherein the first etch method is an anisotropic plasma etch method.

5. The method of claim 1 wherein the metal silicide forming metal layer is formed from a metal silicide forming metal selected from the group consisting of titanium, tungsten, cobalt, molybdenum and platinum.

6. The method of claim 1 wherein the second etch method is an anisotropic ion sputter etch method.

7. A method for forming a Schottky diode comprising:
   providing a semiconductor substrate;
   forming upon the semiconductor substrate an anisotropically patterned first dielectric layer which defines a Schottky diode contact region of the semiconductor substrate;
   forming and aligning upon the anisotropically patterned first dielectric layer a patterned second dielectric layer which is formed of a thermally reflowable material;
   reflowing thermally the patterned second dielectric layer to form a thermally reflowed patterned second dielectric layer having a uniform sidewall profile with respect to the anisotropically patterned first dielectric layer while simultaneously forming a thermal silicon oxide layer upon the Schottky diode contact region of the semiconductor substrate;
   etching while employing a first etch method the thermal silicon oxide layer from the Schottky diode contact region of the semiconductor layer while preserving the uniform sidewall profile of the thermally reflowed patterned second dielectric layer with respect to the anisotropically patterned first dielectric layer;
   forming upon the thermally reflowed patterned second dielectric layer and contacting the Schottky diode contact region of the semiconductor substrate a metal silicide forming metal layer;
   annealing thermally in an oxidizing atmosphere the semiconductor substrate and the metal silicide forming metal layer to form in a self aligned fashion a metal silicide layer upon the Schottky diode contact region of the semiconductor substrate, a protective oxide surface layer upon the metal silicide layer and a metal silicide forming metal layer residue upon the thermally reflowed patterned second dielectric layer;
   stripping from the thermally reflowed patterned second dielectric layer the metal silicide forming metal layer residue; and etching while employing a second etch method the protective oxide surface layer from the metal silicide layer, the second etch method also preserving the uniform sidewall profile of the thermally reflowed patterned second dielectric layer with respect to the anisotropically patterned first dielectric layer.

8. The method of claim 7 wherein the first etch method is an anisotropic plasma etch method.

9. The method of claim 7 wherein the metal silicide forming metal layer is formed from a metal silicide forming metal selected from the group consisting of titanium, tungsten, cobalt, molybdenum and platinum.

10. The method of claim 7 wherein the second etch method is an anisotropic ion sputter etch method.

* * * * *